(12) United States Patent
Lee

(10) Patent No.: US 6,707,728 B2
(45) Date of Patent: Mar. 16, 2004

(54) SIGNAL DELAY CONTROL CIRCUIT IN A SEMICONDUCTOR MEMORY DEVICE

(75) Inventor: Jae Jin Lee, Kyoungki-do (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 0 days.

(21) Appl. No.: 10/152,267

(22) Filed: May 21, 2002

(65) Prior Publication Data

US 2003/0002356 A1 Jan. 2, 2003

(30) Foreign Application Priority Data

Jun. 29, 2001 (KR) ........................ 2001-38019

(51) Int. Cl.$^7$ .................. G11C 7/00; G11C 11/00; G11C 8/00
(52) U.S. Cl. ............... 365/194; 365/189.09; 365/148; 365/189.07; 365/193; 365/233
(58) Field of Search ................ 365/194, 233, 365/189.09, 193, 189.07, 148

(56) References Cited

U.S. PATENT DOCUMENTS

| | | | |
|---|---|---|---|
| 5,263,000 A | 11/1993 | Van Buskirk et al. | 365/226 |
| 5,473,198 A | 12/1995 | Hagiya et al. | 257/786 |
| 5,548,560 A | 8/1996 | Stephens, Jr. et al. | 365/233.5 |
| 5,757,705 A | 5/1998 | Manning | 365/201 |
| 5,841,093 A * | 11/1998 | Wada | 219/69.17 |
| 5,933,379 A | 8/1999 | Park et al. | 365/201 |
| 5,991,232 A | 11/1999 | Matsumura et al. | 365/233 |
| 6,055,209 A | 4/2000 | Abo | 365/233 |
| 6,057,910 A * | 5/2000 | Dunne | 356/5.05 |
| 6,166,989 A | 12/2000 | Hamamoto et al. | 365/233 |
| 2002/0190255 A1 * | 12/2002 | Kitahara et al. | 257/69 |

FOREIGN PATENT DOCUMENTS

| | | |
|---|---|---|
| JP | 6-350052 | 12/1994 |
| JP | 8-139287 | 5/1996 |
| JP | 11-306763 | 5/1999 |
| JP | 2000-21177 | 1/2000 |

* cited by examiner

*Primary Examiner*—David Nelms
*Assistant Examiner*—Ly Duy Pham
(74) *Attorney, Agent, or Firm*—Marshall, Gerstein & Borun LLP

(57) ABSTRACT

A signal delay control circuit for use in a semiconductor memory device is disclosed. The circuit includes a first reference voltage generating unit for generating a first reference voltage; a second reference voltage generating unit for generating a second reference voltage that is lower than the first reference voltage; a control signal generating unit for generating a clock signal to drive input and output operations of internal circuits; and an impedance circuit in circuit with the first and second reference voltage generating units for generating a plurality of reference voltages to be applied to the internal circuits wherein the reference voltages are set in accordance with a distance between the control signal generating unit and the respective one of the internal circuits.

2 Claims, 8 Drawing Sheets

SIGNAL DELAY CONTROL CIRCUIT IN A SEMICONDUCTOR MEMORY DEVICE

FIELD OF THE INVENTION

The present invention relates generally to semiconductor memory devices and, more specifically, to a signal delay control circuit for use in a memory device to improve the delay difference of signals resulting from components or circuits spaced a different distance from a transmission device such as a control circuit.

BACKGROUND OF THE INVENTION

In a general semiconductor memory device, signal delays proportional to the propagation distances occur when a signal is transmitted from a specific position to circuit elements or devices at various positions. A typical configuration of a semiconductor memory device wherein signal delays are dependent on propagation distance of signals is illustrated in FIG. 1. As shown in FIG. 1, a control signal such as a clock signal is generated from a control signal generator 1 which is positioned at the center area of a chip. An output pin DQm of a data pin array is located relatively near to the control signal generator 1 while an output pin DQ1 is relatively far away from the control signal generator 1. When data bits are output from the output pins DQ1 to DQm in response to the clock signal generated from the control signal generator 1, a data bit from DQm outputs earlier than that from DQ1.

Also, an address pin A1 is relatively near to the control signal generator 1 while an address pin An is relatively far away from the control signal generator 1. Thus, when address bits are input into the chip through the address pins A1 to An in response to the clock signal generated from the control signal generator 1, the input of the address bit through address pin A1 is faster than that through address address pin An.

Referring to FIG. 2, a clock signal A is applied to a data input/output circuit which is near to the control signal generator 1 while a clock signal B is applied to another data input/output circuit which is far away from the control signal generator 1. The slopes at the rising edges of the clock signals A and B are different from each other.

Briefly, a delay difference between pins based on input positions of the clock signal, is usually more than 1 ns (nanosecond) in a semiconductor memory chip having a chip size of 1 cm by 2 cm and having data output pins disposed at the side region stretching over 1 cm.

As aforementioned, a device which outputs data signals synchronized with the clock signal (e.g., SDRAM (synchronous DRAM)), has various output times due to the difference of the slope of the rising edge (or a rising time of the clock signal) in accordance with the distance between the control signal generator 1 and the data input/output circuits. A data output circuit adjacent to the control signal generator 1 outputs a data bit quickly, while another data output circuit located away from the control signal generator 1 outputs a data bit slowly. Such a difference in data output time causes a valid data window to be narrower and acts as an obstacle for high frequency operation.

In order to minimize the difference in data output time, transmission lines of clock signals are conventionally arranged with a tree shape in order to unify the distance between a clock driver (e.g., the control signal generator 1) and data output buffers. However, there is a problem in the conventional approach in that an excessive increase of circuit area is required for adjusting minute delay times.

SUMMARY OF THE INVENTION

In accordance with an aspect of the invention, a signal delay control circuit is provided for use in a semiconductor memory device. The signal delay control circuit comprises a first reference voltage generating unit for generating a first reference voltage; a second reference voltage generating unit for generating a second reference voltage that is lower than the first reference voltage; a control signal generating unit for generating a clock signal to drive an operation of internal circuits; and an impedance circuit in circuit with the first and second reference voltage generating units for generating a plurality of reference voltages to be applied to respective ones of the internal circuits. Each of the reference voltages is set in accordance with a distance between the control signal generating unit and the respective one of the internal circuits.

In accordance with another aspect of the invention, a signal delay control circuit is provided for use in a semiconductor memory device. The signal delay control circuit comprises: a first reference voltage generating unit for generating a first reference voltage; a second reference voltage generating unit for generating a second reference voltage that is lower than the first reference voltage; a control signal generating unit for generating a clock signal to control input and output operations for data bits; a resistive circuit in circuit with the first and second reference voltage generating units for generating a plurality of reference voltages; and a plurality of data output units for outputting data bits from the semiconductor memory device in response to a respective one of the reference voltages. Each of the reference voltages corresponds to a distance between the control signal generating unit and a respective one of the data output units.

In accordance with another aspect of the invention, a signal delay control circuit is provided for use in a semiconductor memory device. The signal delay control circuit comprises: a first reference voltage generating unit for generating a first reference voltage; a second reference voltage generating unit for generating a second reference voltage that is lower than the first reference voltage; a control signal generating unit for generating a clock signal to control input operations for address bits; a resistive circuit in circuit with the first and second reference voltage generating units for generating a plurality of reference voltages; and a plurality of address input circuits for controlling strobe operations in response to a respective one of the reference voltages. Each of the reference voltages corresponds to a distance between the control signal generating unit and a respective one of the address input circuits.

In accordance with still another aspect of the invention, a signal delay control circuit is provided for use in a semiconductor memory device. The signal delay control circuit comprises: a first reference voltage generating unit for generating a first reference voltage; a second reference voltage generating unit for generating a second reference voltage that is lower than the first reference voltage; a control signal generating unit for generating a clock signal to control operations of sense amplifiers; a resistive circuit in circuit with the first and second reference voltage generating units for generating a plurality of reference voltages; and a plurality of sense amplifier drive circuits for controlling operations of sense amplifiers in response to a respective one of the reference voltages. Each of the reference voltages corresponds to a distance between the control signal generating unit and a respective one of the address input circuits.

DESCRIPTION OF THE PREFERRED EXAMPLES

Figure 1:
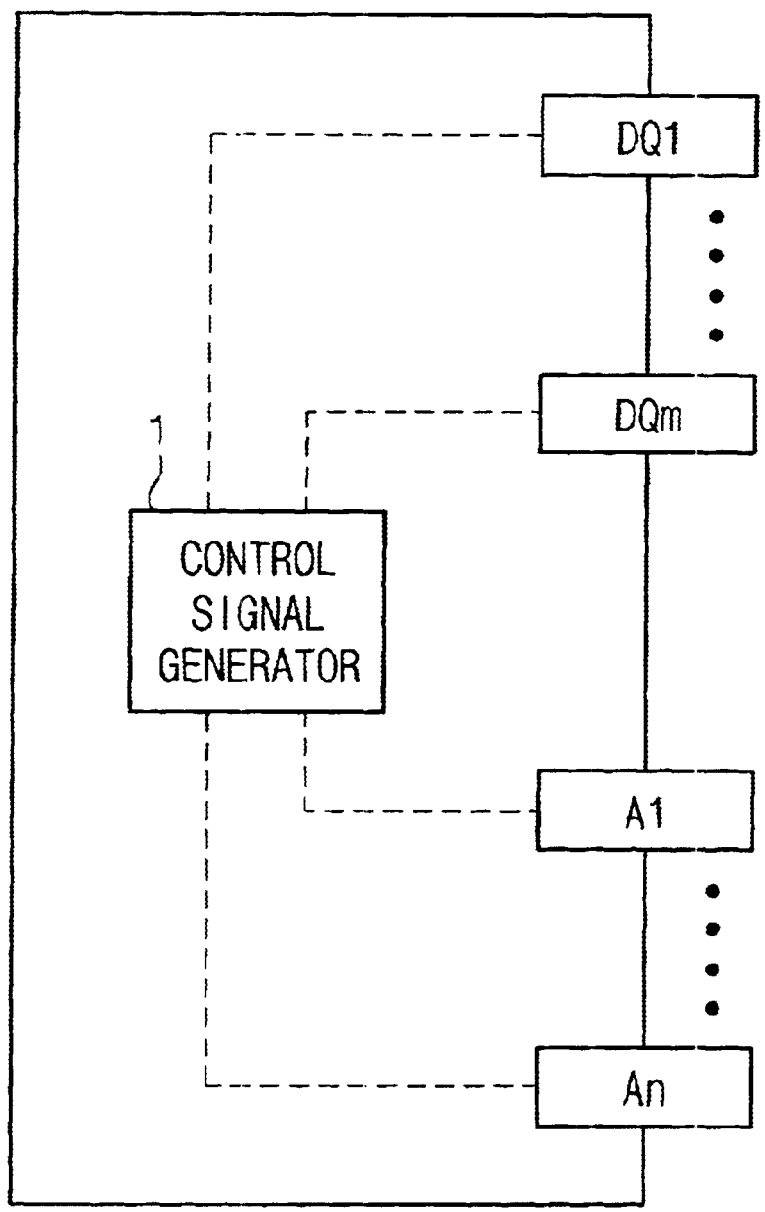
FIG. 1 is a schematic diagram illustrating an arrangement of pins on a conventional semiconductor memory device.
Figure 2:
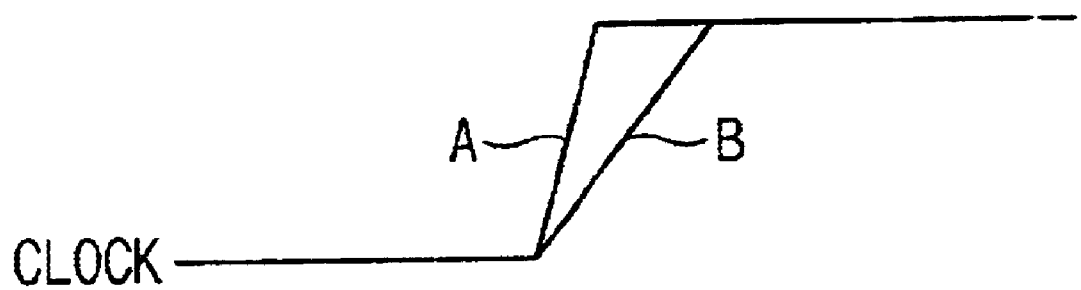
FIG. 2 is a waveform diagram explaining a signal delay in the conventional semiconductor memory device.
Figure 3:
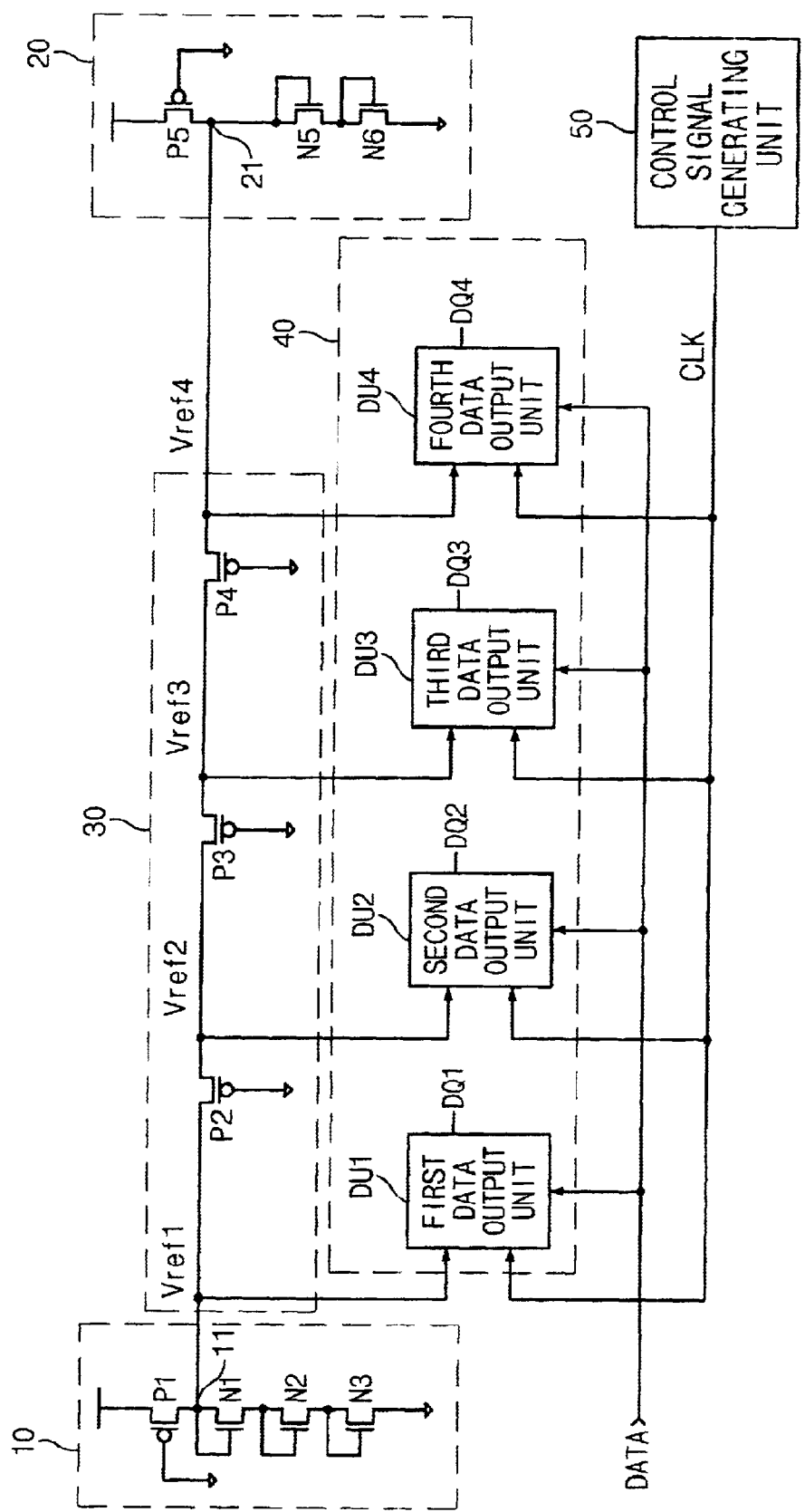
FIG. 3 is a schematic circuit diagram illustrating an exemplary signal delay control circuit of a semiconductor memory circuit constructed in accordance with the teachings of the present invention.

FIG. 3 shows a signal delay control circuit. The signal delay control circuit includes first and second reference voltage generating units 10 and 20, a resistor circuit 30, a data output block 40 and a control signal generating unit 50. The resistor circuit 30, connected between output terminals of the first and second reference voltages, outputs different reference voltages to each data unit DU1, DU2, DU3, DU4 in the data output block 40. The control signal generating unit 50 generates a clock signal and a control signal to control an operation of transmitting data. The data output units DU1, DU2, DU3, DU4 of the data output block 40 respectively output data in response to the clock signal supplied from the control signal generating unit 50. The data output block 40 includes a plurality of data output units. Four data output units DU1 to DU4 are shown in this example, but other numbers are possible.

The first reference voltage generating unit 10 includes a PMOS transistor P1 connected between a power supply voltage terminal and an output terminal 11. It also includes NMOS transistors N1 to N3 connected in series between the output terminal 11 and a ground voltage terminal. The PMOS transistor P1 has a gate coupled to the ground voltage terminal and is used as a load element. The gates and drains of the NMOS transistors N1 to N3 are connected in common. The NMOS transistors N1 to N3 are used as a diode.

The second reference voltage generating unit 20 includes a PMOS transistor P5 connected between the power supply voltage terminal and an output terminal 21. It also includes NMOS transistors N5 and N6 connected in series between the output terminal 21 and the ground voltage terminal. The PMOS transistor P5 has a gate coupled to the ground voltage terminal and is used as a load element. The gates and drains of the NMOS transistors N5 and N6 are connected in common. The transistors N5 and N6 are used as a diode.

The first and second reference voltage generating units 10 and 20 are connected through the resistor circuit 30. The resistor circuit 30 is formed of PMOS transistors P2 to P4. The PMOS transistors P2 to P4 are connected in series between the reference output terminals 11 and 21. The gates of the PMOS transistors P2 to P4 are coupled to the ground voltage terminal so that the PMOS transistors P2 to P4 are always turned on.

In the resistor circuit 30, reference voltages Vref1 to Vref4 are provided to respective data output units DU1 to DU4 of the data output block 40. Also, a clock signal CLK supplied from the control signal generating unit 50 is applied to enable operations of the data output units DU1 to DU4.

The reference voltages Vref1 to Vref4 are established at nodes between the PMOS transistors P2 to P4, between the first voltage generating unit 10 and the transistor P2, and between transistor P4 and the second voltage generating unit 20. The reference voltages Vref1 to Vref4 are established to correspond to distances between the data output units DU1 to DU4 and the control signal generating unit 50. Each reference voltage Vref1 to Vref4 is assigned to one of the data output units DU1 to DU4. A data bit DATA is applied to the data output units in common.

Figure 4:
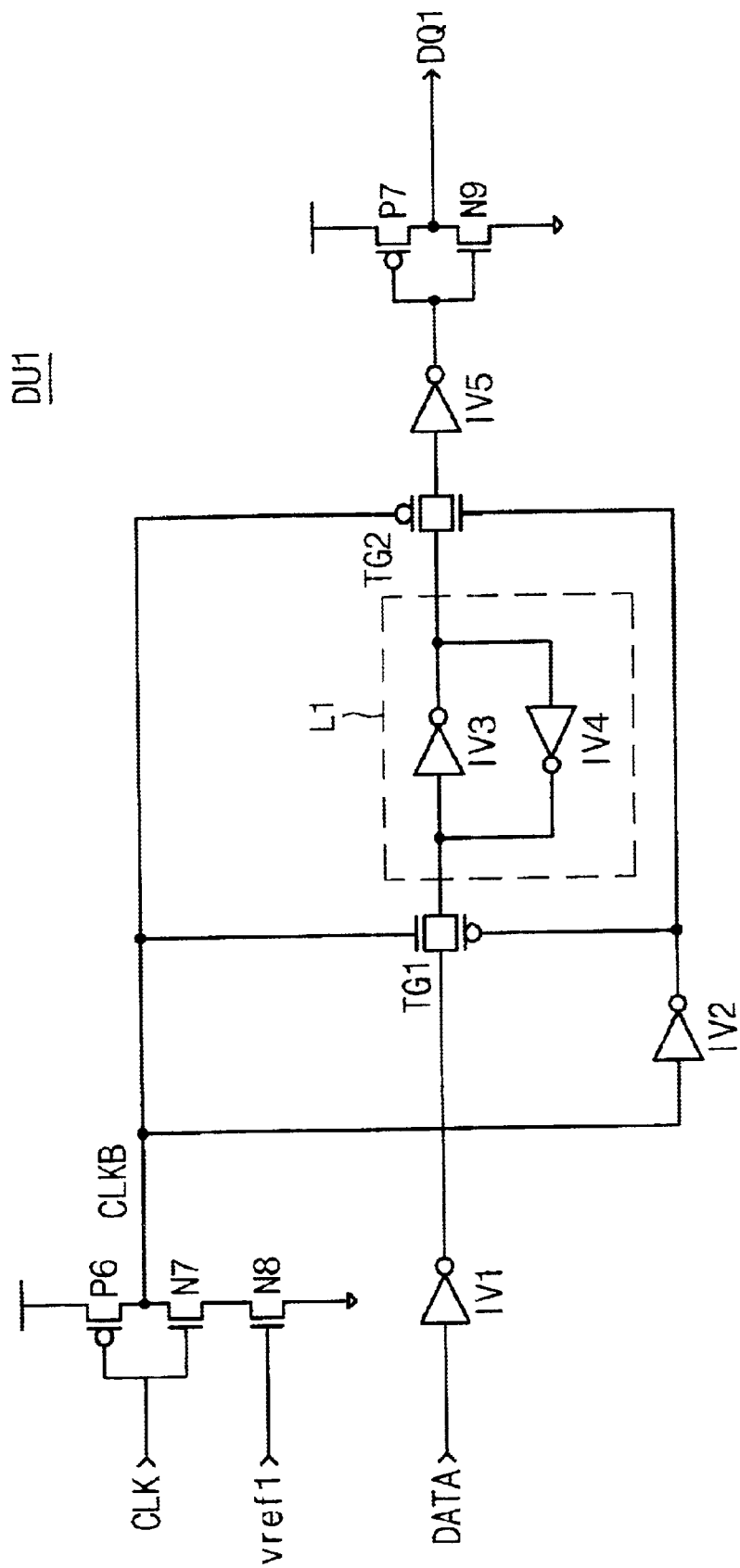
FIG. 4 is a circuit diagram of an exemplary data output circuit employed in the signal delay circuit shown in FIG. 3.

FIG. 4 is a detailed illustration of an exemplary data output unit (e.g., the first data output unit DU1). The structures of the data output units DU1 to DU4 are preferably the same. Referring to FIG. 4, the first data output unit DU1 includes PMOS transistor P6 and NMOS transistors N7 to N8, which are connected in series between the power supply voltage terminal and the ground voltage terminal. An inverted clock signal (CLKB) of a clock signal (CLK) is generated at a common drain node of the PMOS transistor P6 and NMOS transistor N7. Gates of the PMOS transistor P6 and NMOS transistor N7, are commonly coupled to the clock signal CLK from the control signal generating unit 50. A gate of the NMOS transistor N8 is coupled to the reference voltage Vref1.

A data bit DATA applied to the first data output unit DU1 is transferred to a transmission gate TG1 through an inverter IV1. One electrode of the transmission gate TG1 is directly coupled to the inverted clock signal CLKB, and another electrode of the transmission gate TG1 is coupled to CLKB through an inverter IV2.

The data bit DATA passing through the transmission gate TG1 is transferred to a transmission gate TG2 through a latch L1 formed of inverters IV3 and IV4.

One electrode of the transmission gate TG2 is directly coupled to the inverted clock signal CLKB, and another electrode of the transmission gate TG2 is coupled to CLKB through an inverter IV2.

The data bit DATA passing through the transmission gate TG2 is applied through an inverter IV5 to a common gate node of PMOS and NMOS transistors, P7 and N9, which are connected between the power supply voltage terminal and the ground voltage terminal. The data bit DATA is generated at the output pin DQ1 through a common drain node of the PMOS and NMOS transistors P7 and N9.

The first data output unit DU1, as shown in FIG. 3, is the one that is furthest from the control signal generating unit 50 supplying the clock signal CLK. The nearest data output unit is DU4. In the convention used herein, the data output units are referenced as "Dum", where m is a number indicating the relative distance from the control signal generating unit 50 in decreasing order. In the example of FIG. 3, the nomenclature indicates that, of the data output units DU4, DU3, DU2, and DU1, DU4 is closest, DU3 is next closest, DU2 is next closest, and DU1 is farthest relative to the unit 50.

When the clock signal CLK is applied to the data output block 40 in common, the reference voltages Vref1 to Vref4 corresponding to the distances between the control signal generating unit 50 and the respective data output units DU1 to DU4 are applied to their corresponding data output units DU1 to DU4.

As shown in FIG. 4, the clock signal CLK can be applied to the transmission gates TG1 and TG2 when the NMOS transistor N8 is turned on by the reference voltage Vref1. As a result, an arrival time of the clock signal CLK (or CLKB) at the transmission gates TG1 and TG2 is controlled by the turn-on time of the NMOS transistor N8 in responding to the reference voltage Vref1. Though the clock signal CLK is applied to the data output unit DU1 with a small value of a rising slope due to a time delay through a path between the control signal generating unit 50 and the first data output unit DU1, the reference voltage Vref1 has a voltage level regarding the time delay and can, therefore, compensate for the physical time delay.

An operation of the signal delay control circuit shown in FIG. 3 will now be explained. It is assumed that the reference voltage Vref1 is established at 3V by the first reference voltage generating unit 10 and the reference voltage Vrefm (i.e., node 21) is established at 2V by the second reference voltage generating unit 20.

When the clock signal CLK is commonly applied to the data output units DU1 to DU4 (which are located different distances from the control signal generating unit 50), the data output units DU1 to DU4 receive the clock signal CLK with different rising slopes. A rising time of the clock signal CLK applied to the data output unit DU1 is fastest, while a rising time of the clock signal CLK is slowest.

Figure 5:
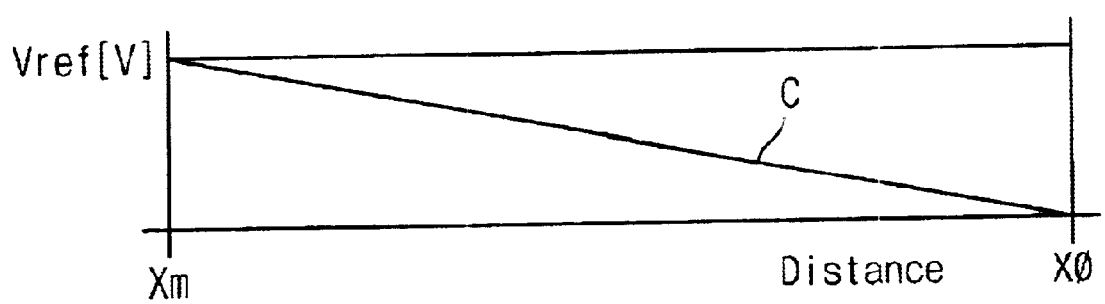
FIGS. 5 and 6 are schematic diagrams explaining a characteristic of the data output circuit shown in FIG. 4.

As shown in FIG. 5, in an example where: (1) a plurality of reference voltages (e.g., Vref1 to Vrefm; where m is an integer) are provided corresponding to a plurality of data output units (e.g., DU1 to DUm); and (2) each of the data output units has a different distance (e.g., X0 to Xm) from the control signal generating unit 50, the reference voltages Vref1 to Vrefm are established such that their magnitudes decrease in relation to their corresponding positions Xm (the nearest position from the control signal generating unit 50) to X0 (the farthest position from the control signal generating unit 50), along a linear plot C representing an increasing rate of the reference voltages. That is, the lowest reference voltage Vrefm (i.e., Vref4 in FIG. 3), (e.g., 2V), is applied to the nearest data output unit DUm while the highest reference voltage Vref1 (e.g., 3V), is applied to the farthest data output unit DU1. The data output circuit located at the intermediate distance from the control signal generating unit 50 will receive the intermediate reference voltage (e.g., 2.5V).

Figure 6:
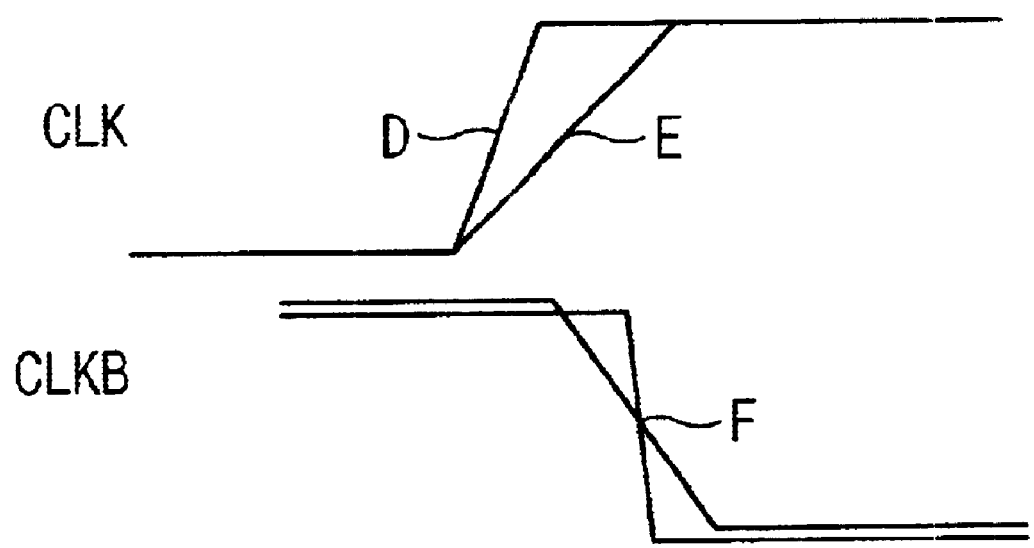

As a result, as shown in FIG. 6, the farthest data output unit DU1 responds to the clock signal having the slowest rising edge E but receives the highest reference voltage Vref1. On the other hand, the nearest data output unit DUm responds to the clock signal having the fastest rising edge D and receives the lowest reference voltage Vrefm (i.e., Vref4 in FIG. 3). The difference between the rising edges D and E is caused from the difference of distance between the control signal generating unit 50 and the data output block 40, due to physical delays on the clock signal paths between the control signal generating unit 50 and the data output block 40. The lowest reference voltage Vrefm (i.e., Vref4) makes the clock signal with the fastest rising edge D be introduced into the nearest data output unit DUm more slowly than any of the other reference voltages, assuming that the other data output circuits associated with the other reference voltages receive the clock signal CLK relatively later than the data output unit DUm. The highest reference voltage Vref1 makes the clock signal with the fastest rising edge D be introduced into the farthest data output unit DU1 faster than any of the other reference voltages, assuming that the other data output circuits associated with the other reference voltages receive the clock signal CLK relatively earlier than the data output unit DUm.

Thus, the reference voltages Vref1 to Vrefm, which correspond to the distances between the control signal generating unit 50 and the data output units DU1 to DUm, can compensate the difference of the rising slopes of the clock signal applied thereto, thereby offsetting the difference of delay times of the clock signal CLK, as shown at waveform F of a clock signal CLKB in FIG. 6. Data output times of the data output units are, thus, substantially equalized.

While the reference voltages are generated from the first and second reference voltage generating units 10 and 20, one of the reference voltages can be assigned to the power supply voltage or the ground voltage supplied from the external voltage source.

Further, it is possible not only to maintain the potentials of the reference voltages during all operation periods of the semiconductor memory chip, but also to use the reference voltages exclusively in a specific operation period. Such exclusive use in a specific operation mode would reduce current which flows between the output terminals of the first and second reference voltage generating units 10 and 20 due to a voltage difference.

The disclosed technique is available for use with other internal circuits, such as address input circuits and sense amplifier drive circuits, which respond to the clock signal in a synchronous semiconductor memory device, as well as to the data output circuits.

Figure 7:
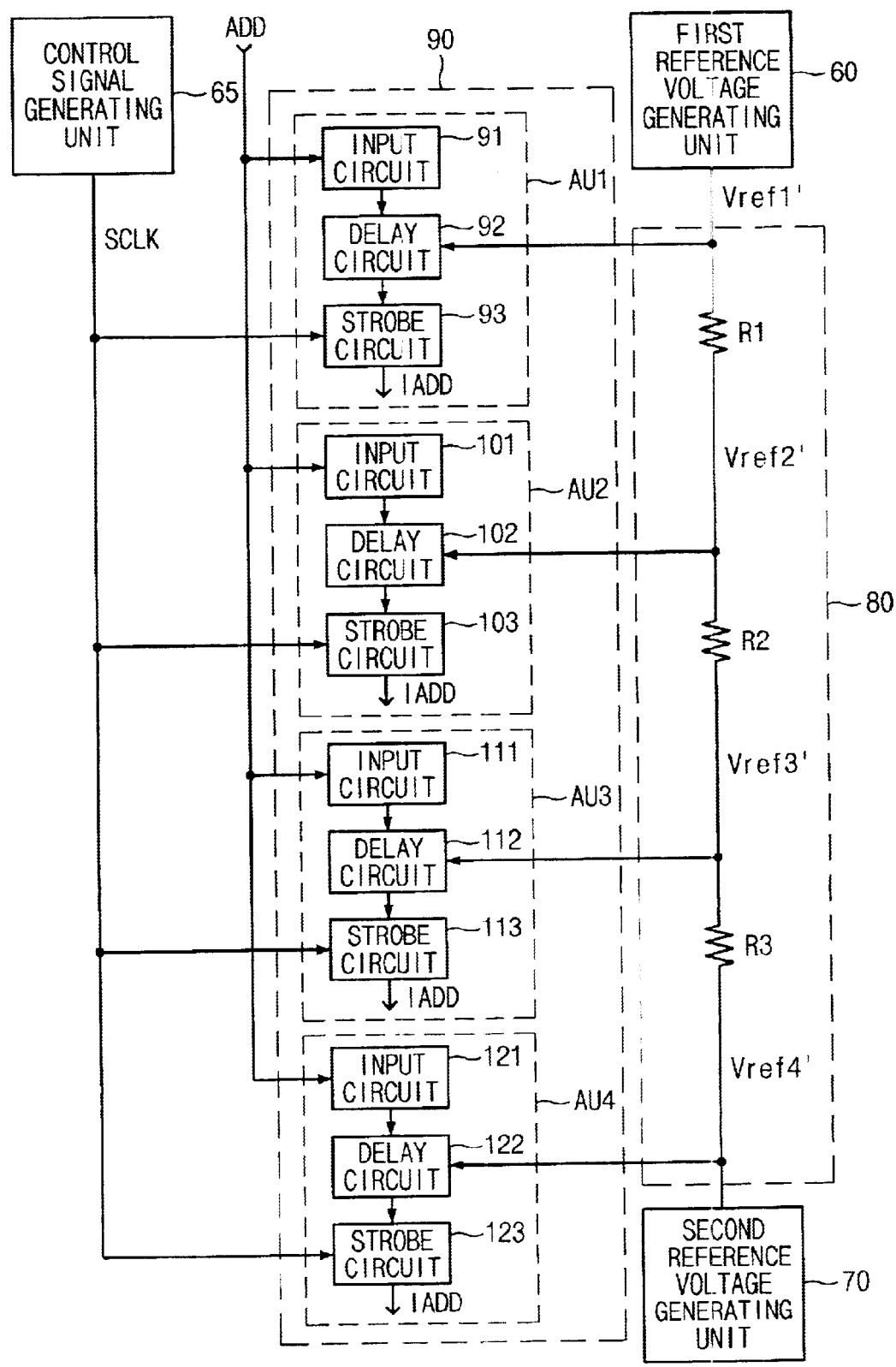
FIG. 7 is a schematic diagram of another exemplary signal delay control circuit constructed in accordance with the teachings of the present invention.

FIG. 7 shows another exemplary signal delay control circuit applied to address input circuits. In general, the address input circuits, like the data output circuits, experience a problem resulting from differences in distance between the address input circuits and the device transmitting a drive signal. The problem is induced by discordance between setup time and hold time of input signals.

As shown in FIG. 7, the address input circuits AU1 to AU4 of a synchronous memory device are arranged to overcome the problems with the setup and hold times. The address input circuits AU1 to AU4 make address strobe times of all the address input circuits be synchronized to a predetermined time by applying reference voltages corresponding to the distances between a control signal generating unit 65 and the corresponding address input circuits AU1 to AU4. The number of the address input circuits is an example. Other numbers of the address input circuits could alternatively be employed.

Referring to FIG. 7, the signal delay control circuit for address input includes first and second reference voltage generating units 60 and 70, a resistor circuit 80, a control signal generating unit 65 and the address input circuits AU1 to AUn (where n is a positive integer). The first and second reference voltage generating units 60 and 70 (which are located at both ends of an address input circuit block 90 including the address input circuits AU1 to AUn), generate reference voltages with different levels. A resistor circuit 80 provides the reference voltages Vref1' to Vref4' to the address input circuits AU1 to AUn. A control unit 65 generates a strobe clock signal SCLK to control input operations at the address input circuits AU1 to AUn. The address input circuits receive address signals and control address strobe in response to the strobe clock signal SCLK. The resistor circuit 80, which include resistors R1 to R3 connected in series between the first and second reference voltage generating units 60 and 70, establishes the reference voltages Vref1' to Vref4' at nodes between the resistors R1 to R3, at a node between the first reference voltage generating unit 60 and a resistor R1, and at a node between the second reference voltage generating unit 70 and the resistor R3. The reference voltages Vref1' to Vref4' are inversely proportional to the distances between the control signal generating unit 65 and the address input circuits AU1 to AU4.

Each of the address input circuits AU1 to AU4 includes an input circuit 91, 101, 111, and 121, a delay circuit 92, 102, 112, and 122, and a strobe circuit 93, 103, 113, and 123. The input circuits receive an address bit. The delay circuits provide a delay path for the input address bit in order to compensate the physical delays of the strobe clock signal SCLK in response to the reference voltage having a voltage level corresponding to the physical delay of the strobe clock signal SCLK. The strobe circuits hold the strobe clock signal SCLK by an internal clock signal and transfer the address bit into a decoder as an internal address bit IADD.

Since the distances of transmitting the strobe clock signal SCLK from the control signal generating unit 65 to the respective address input circuits AU1 to AU4 are different from each other, a lower reference voltage is applied to a delay circuit of an address input circuit which is nearer to the control signal generating unit 65, while a higher reference voltage is applied to a delay circuit of an address input circuit which is more distant from the control signal generating unit 65.

Thus, a delay time of the delay circuit 92, 102, 112 and 122 in an address input circuit (e.g., AU1) which is nearer to the control signal generating unit 65 is longer than that in an address input circuit (e.g., AU4) which is more distant from the control signal generating unit 65. Namely, the delay times in the address input circuits AU1 to AU4 are differentiated from each other in accordance with their differences of distance from the control signal generating unit 65.

As a result, the signal delay control structure for the address input circuits can compensate discordance of the setup and hold times due to the differences of the distance between the address input circuit block 90 and the control signal generating unit 65 generating a control signal for address strobe operations thereof.

Figure 8:
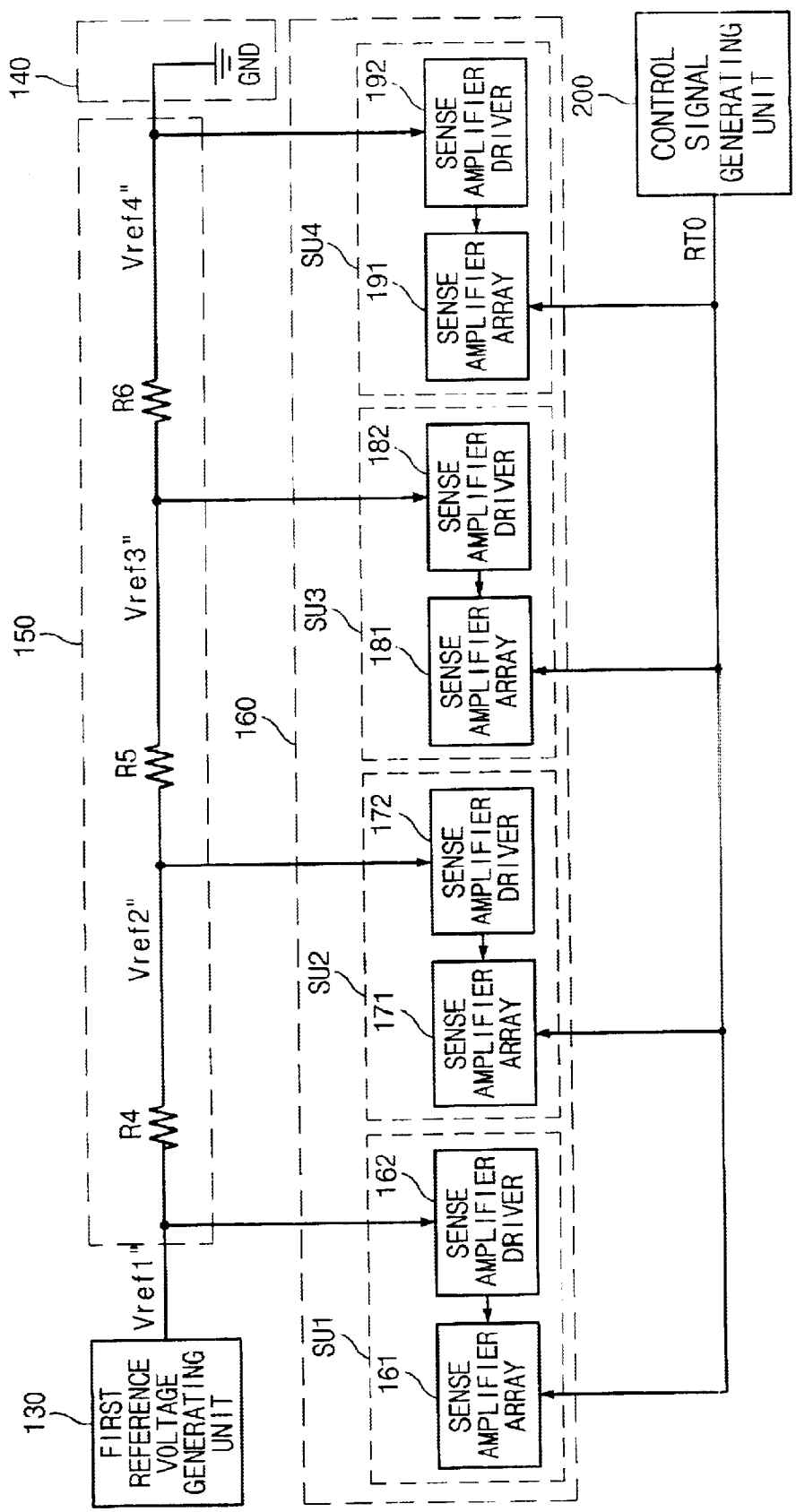
FIG. 8 is a schematic diagram of still another signal delay control circuit constructed in accordance with the teachings of the present invention.

The disclosed techniques are also applicable to sense amplifier drive circuits as shown in FIG. 8. The number of the sense amplifier drive circuits shown in FIG. 8 is exemplary in nature. Other numbers of sense amplifier drive circuits could alternatively be employed.

Referring to FIG. 8, the illustrated signal delay control circuit for the sense amplifier drive circuits includes a first reference voltage generating unit 130, a second reference voltage generating unit 140, a resistor circuit 150, a control signal generating unit 200, and the sense amplifier drive circuits SU1 to SU4. The first and second reference voltage generating units 130 and 140 (which are located at both ends of a sense amplifier drive block 160 including the sense amplifier drive circuits SU1 to SU4), generate reference voltages with different levels. A resistor circuit 150 provides corresponding ones of the reference voltages Vref1" to Vref4" to the sense amplifier drive circuits SU1 to SU4. A control signal generating unit 200 generates a signal RTO to control the sense amplifiers. The sense amplifier drive circuits SU1 to SU4 receive the signal RTO. The second reference voltage generating unit 140 employs a ground voltage GND as the second reference voltage source. The resistor circuit 150, (which is formed of resistors R4 to R6 which are connected in series between the first reference voltage generating unit 130 and the second reference voltage generating unit 140), establishes the reference voltages Vref1" to Vref4" at nodes between the resistors R4 to R6, at a node between the first reference voltage generating unit 130 and the resistor R4, and at a node between the second reference voltage generating unit 140 and the resistor R6. The reference voltages Vref1" to Vref4" are inversely proportional to the distances between the control signal generating unit 200 and the sense amplifier drive circuits SU1 to SU4.

Each of the sense amplifier drive circuits SU1 to SU4 is composed of: (a) a sense amplifier array (e.g., 161, 171, 181, or 191) receiving the signal RTO from the control signal generating unit 200, and (b) a sense amplifier driver (e.g., 162, 172, 182, or 192) activating the sense amplifier array in response to its corresponding reference voltage appropriately set by the resistor circuit 150.

In an operation of the circuit shown in FIG. 8, the sense amplifier drivers activate the sense amplifier arrays in response to their corresponding reference voltages provided from the resistor circuit 150. The ground voltage GND is the lowest reference voltage and is applied to the driver 192 of the sense amplifier drive circuit SU4 which is nearest to the control signal generating unit 200 generating the signal RTO. The ground voltage GND makes the driver 192 conductive at a slow rate so as to reduce drivability of the sense amplifier array 191 of the nearest sense amplifier drive circuit SU4. On the other hand, the reference voltage Vref1" is the highest reference voltage and is applied to the sense amplifier array 161 of the sense amplifier drive circuit SU1 that is most distant from the control unit 200. As a result, drivability of the sense amplifier array 161 of the most distant sense amplifier drive circuit SU1 is enhanced relative to the others.

The adjustment of the different reference voltages in accordance with the transmission distances of the signal RTO minimizes timing discordance between the sense amplifier operations over the circuits SU1 to SU4 even when there is transmission skew of the signal RTO.

While the ground voltage GND is utilized as the second reference voltage, it is also possible to employ other circuits such as the second reference circuits shown in FIGS. 3 and 8. Similarly, the power supply voltage may be also used for the first reference voltage source. The teachings of the present invention are applicable to a general semiconductor memory device which experiences a transmission skew of a control signal that is applied to a plurality of internal circuits such as the data output circuits, address input circuits, or the sense amplifier drive circuits, as well as to the synchronous semiconductor memory device.

As described above, the disclosed devices produce improved operation timings of drive circuits by compensating or offsetting differences of transmission delays of a control signal that is applied to the drive circuits from a control unit. This technique is advantageous in minimizing discordance of data output times by discriminately activating data output circuits in accordance with the distances between the respective data output circuits and a control unit generating a control signal that is applied to the data output circuits. Moreover, this technique is helpful to synchronize address input times by minimizing differences of setup and hold times in address input circuits, and to stabilize operations of sense amplifiers.

From the foregoing, persons of ordinary skill in the art will appreciate that a signal delay circuit for use in a semiconductor memory device has been provided which is capable of driving internal circuits without time differences of signal delay in the input and output operations. It will further be appreciated that a circuit has been provided which is capable of minimizing difference of output time at multiple output terminals by applying various voltages in accordance with the distance between a control signal source and the respective output terminals. It will further be appreciated that a circuit has been provided which is capable of synchronizing address input times by minimizing a time difference between a setup time and a hold time of an address input circuit. It will further be appreciated that a circuit has been provided which is capable of stabilizing operation states of sense amplifiers by synchronizing the conduction times of the sense amplifiers.

Although certain apparatus constructed in accordance with the teachings of the invention have been described herein, the scope of coverage of this patent is not limited thereto. On the contrary, this patent covers all embodiments of the teachings of the invention fairly falling within the scope of the appended claims either literally or under the doctrine of equivalents.

What is claimed is:

1. A signal delay control circuit for use in a semiconductor memory device, the signal delay control circuit comprising:

a first reference voltage generating unit for generating a first reference voltage;

a second reference voltage generating unit for generating a second reference voltage that is lower than the first reference voltage;

a control signal generating unit for generating a clock signal to drive an operation of internal circuits; and an impedance circuit in circuit with the first and second reference voltage generating units for generating a plurality of reference voltages to be applied to respective ones of the internal circuits, wherein each of the reference voltages is set in accordance with a distance between the control signal generating unit and the respective one of the internal circuits.

2. The signal delay control circuit of claim 1, wherein the internal circuits are one of the group comprising data output circuits, address input circuits, and sense amplifier drive circuits.

* * * * *